United States Patent
Seo

(10) Patent No.: US 11,823,975 B2
(45) Date of Patent: Nov. 21, 2023

(54) SEMICONDUCTOR PACKAGES INCLUDING DIFFERENT TYPE SEMICONDUCTOR CHIPS HAVING EXPOSED TOP SURFACES AND METHODS OF MANUFACTURING THE SEMICONDUCTOR PACKAGES

(71) Applicant: SK hynix Inc., Icheon-si (KR)

(72) Inventor: Hyun Chul Seo, Icheon-si (KR)

(73) Assignee: SK hynix Inc., Icheon-si (KR)

(*) Notice: Subject to any disclaimer, the term of this patent is extended or adjusted under 35 U.S.C. 154(b) by 93 days.

(21) Appl. No.: 17/523,698

(22) Filed: Nov. 10, 2021

(65) Prior Publication Data
US 2023/0009221 A1 Jan. 12, 2023

(30) Foreign Application Priority Data
Jul. 12, 2021 (KR) .................. 10-2021-0090892

(51) Int. Cl.
| | |
|---|---|
| *H01L 23/42* | (2006.01) |
| *H01L 23/12* | (2006.01) |
| *H01L 23/00* | (2006.01) |
| *H01L 21/56* | (2006.01) |

(52) U.S. Cl.
CPC ............ *H01L 23/42* (2013.01); *H01L 21/566* (2013.01); *H01L 23/12* (2013.01); *H01L 24/92* (2013.01); *H01L 2223/58* (2013.01); *H01L 2224/92125* (2013.01)

(58) Field of Classification Search
CPC ....... H01L 23/42; H01L 23/12; H01L 21/566; H01L 24/92; H01L 2223/58; H01L 2224/92125
See application file for complete search history.

(56) References Cited

U.S. PATENT DOCUMENTS

| 7,361,995 B2* | 4/2008 | Goh .................. H01L 23/04 257/E23.101 |
|---|---|---|
| 2019/0139937 A1* | 5/2019 | Kuo .................. H01L 21/56 |
| 2020/0126882 A1* | 4/2020 | Jang .................. H01L 23/3738 |

FOREIGN PATENT DOCUMENTS

| KR | 1020120122107 A | 11/2012 |
|---|---|---|
| KR | 1020200041265 A | 4/2020 |

\* cited by examiner

*Primary Examiner* — Peniel M Gumedzoe
(74) *Attorney, Agent, or Firm* — WILLIAM PARK & ASSOCIATES LTD.

(57) ABSTRACT

A method of manufacturing a semiconductor package includes mounting a first semiconductor chip and a second semiconductor chip on a substrate, forming a first film on a top surface of the first semiconductor chip, and loading the first semiconductor chip and the second semiconductor chip mounted on the substrate between a lower mold frame and an upper mold frame. The method further includes providing a molding material between the lower mold frame and the upper mold frame, removing the lower mold frame and the upper mold frame, and removing the first film on the top surface of the first semiconductor chip to expose the top surface of the first semiconductor chip.

19 Claims, 9 Drawing Sheets

SEMICONDUCTOR PACKAGES INCLUDING DIFFERENT TYPE SEMICONDUCTOR CHIPS HAVING EXPOSED TOP SURFACES AND METHODS OF MANUFACTURING THE SEMICONDUCTOR PACKAGES

CROSS-REFERENCE TO RELATED APPLICATIONS

The present application claims priority of Korean Patent Application No. 10-2021-0090892, filed on Jul. 12, 2021, which is incorporated herein by reference in its entirety.

BACKGROUND

1. Field

Embodiments of the present disclosure provide semiconductor packages including different types of semiconductor chips having exposed top surfaces and methods of forming the semiconductor packages.

2. Description of the Related Art

A semiconductor package having different types of semiconductor chips has been suggested. Accordingly, a technical concept of exposing top surfaces of the semiconductor chips to dissipate heat from the semiconductor chips has been proposed. Mechanical and physical processes such as a grinding process have been proposed to expose the top surfaces of the semiconductor chips.

SUMMARY

A method of manufacturing a semiconductor package according to an embodiment of the present disclosure includes: mounting a first semiconductor chip and a second semiconductor chip on a substrate; forming a first film on a top surface of the first chip; loading the first semiconductor chip and the second semiconductor chip mounted on the substrate between a lower mold frame and an upper mold frame; providing a molding material between the lower mold frame and the upper mold frame; removing the lower mold frame and the upper mold frame; and removing the first film on the top surface of the first semiconductor chip to expose the top surface of the first semiconductor chip.

A method of manufacturing a semiconductor package according to an embodiment of the present disclosure includes: mounting a first semiconductor chip having a first thickness and a second semiconductor chip having a second thickness on a substrate, the first thickness being thinner than the second thickness; forming a first anti-molding film on a top surface of the first semiconductor chip; forming a buffer film on a top surface of the first anti-molding film and a top surface of the second semiconductor chip; forming a molding material on the substrate, the molding material surrounding a side surface of the first semiconductor chip, a side surface of the first anti-molding film, and a side surface of the second semiconductor chip; removing the buffer film; and removing the first anti-molding film to expose a central region of the top surface of the first semiconductor chip. The molding material covers at least one edge of the top surface of the first semiconductor chip.

A semiconductor package in according to an embodiment of the present disclosure includes: a first semiconductor chip having a first vertical thickness and a second semiconductor chip having a second vertical thickness, the first vertical thickness being thinner than the second vertical thickness; and a molding material surrounding side surfaces of the first semiconductor chip and side surfaces of the second semiconductor chip. The molding material includes a first opening exposing a central region of a top surface of the first semiconductor chip while covering at least one edge of the top surface of the first semiconductor chip.

DETAILED DESCRIPTION

FIG. 1A to 1G are diagrams illustrating semiconductor packages 100A-100G according to various embodiments of the present disclosure.

Figure 1A:
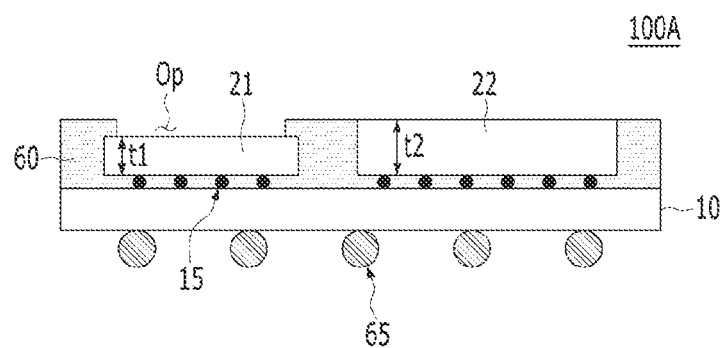
FIGS. 1A to 1G are cross-sectional diagrams illustrating semiconductor packages according to various embodiments of the present disclosure.

Referring to FIG. 1A, a semiconductor package 100A according to an embodiment of the present disclosure may include a first semiconductor chip 21 and a second semiconductor chip 22 mounted on a substrate 10, chip bumps 15, a molding material 60, and package bumps 65.

The substrate 10 may include a printed circuit board (PCB) or a silicon-based redistribution layer.

A first vertical thickness t1 of the first semiconductor chip 21 may be less than a second vertical thickness t2 of the second semiconductor chip 22. A top surface of the first semiconductor chip 21 may be located at a level lower than a top surface of the second semiconductor chip 22. The first semiconductor chip 21 and the second semiconductor chip 22 may be different from each other. For example, the first semiconductor chip 21 may include a memory semiconductor chip such as a DRAM chip, and the second semiconductor chip 22 may include a logic semiconductor chip such as a microprocessor.

The chip bumps 15 may include solder balls or metal pillars. The chip bumps 15 may electrically connect the substrate 10 to the first semiconductor chip 21, and electrically connect the substrate 10 to the second semiconductor chip 22.

The molding material 60 may be provided on the substrate 10 to surround the chip bumps 15, the first semiconductor chip 21, and the second semiconductor chip 22. Specifically, the molding material 60 may cover a lower surface and side surfaces of the first semiconductor chip 21. The molding material 60 may have an opening Op in that the top surface of the first semiconductor chip 21 is only partially covered. For example, the molding material 60 may cover at least one edge of the top surface of the first semiconductor chip 21. Accordingly, the opening Op of the molding material 60 may expose a central region of the top surface of the first semiconductor chip 21. A top surface of the second semiconductor chip 22 may be entirely exposed. For example, the molding material 60 might not be formed on any portion of the top surface of the second semiconductor chip 22.

The package bumps 65 may electrically connect the substrate 10 to an external component such as a motherboard or a signal processing system. The package bumps 65 may include solder balls or metal pillars. In another embodiment, the package bumps 60 may be omitted (not formed).

Because the top surfaces of the first semiconductor chip 21 and the second semiconductor chip 22 are exposed, heat generated in the first semiconductor chip 21 and the second semiconductor chip 22 may be more effectively dissipated.

Figure 1B:
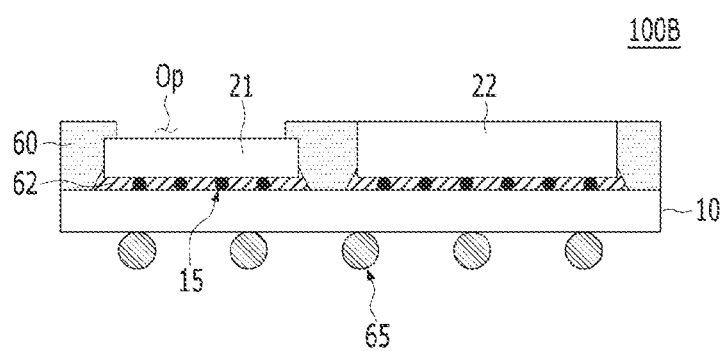

Referring to FIG. 1B, compared with the semiconductor package 100A illustrated in FIG. 1A, a semiconductor package 100B according to an embodiment of the present disclosure may further include an underfill 62. The underfill 62 may be provided between the substrate 10 and the first semiconductor chip 21 and between the substrate 10 and the second semiconductor chip 22. The underfill 62 may cover or surround the chip bumps 15. The underfill 62 may cover or surround portions of side surfaces of the first semiconductor chip 21 and portions of side surfaces of the second semiconductor chip 22. For example, lower portions of the side surfaces of the first semiconductor chip 21 and the second semiconductor chip 22 may be covered or surrounded by the underfill 62.

Figure 1C:
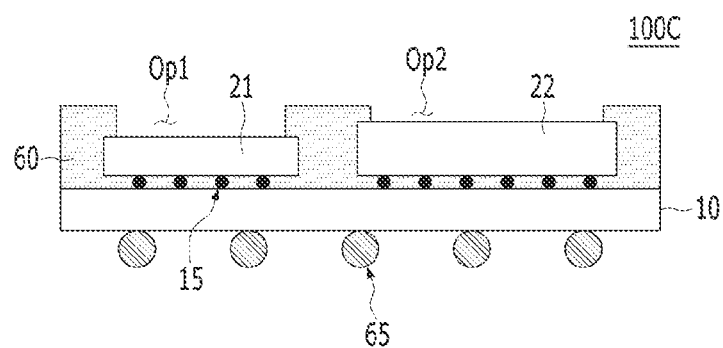

Referring to FIG. 1C, compared with the semiconductor package 100A illustrated in FIG. 1A, the molding material 60 of a semiconductor package 100C according to an embodiment of the present disclosure may have a first opening Op1 and a second opening Op2. The first opening Op1 may expose a top surface of the first semiconductor chip 21. The second opening Op2 may expose a top surface of the second semiconductor chip 22. The molding material 60 may cover at least one edge of the top surface of the first semiconductor chip 21 and at least one edge of the top surface of the second semiconductor chip 22. A depth of the first opening Op1 in the molding material 60 may be greater than a depth of the second opening Op2. A level of the top surface of the first semiconductor chip 21 may be lower than a level of the top surface of the second semiconductor chip 22.

Figure 1D:
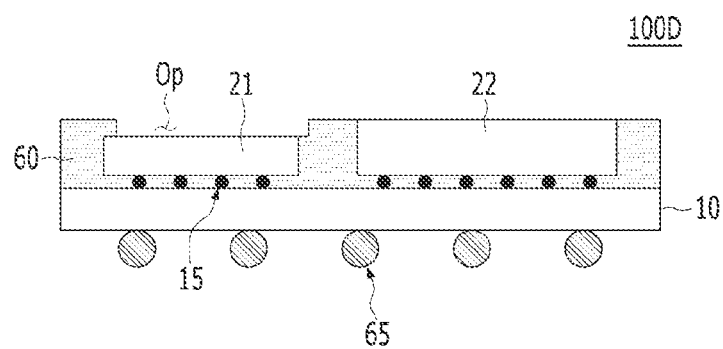

Referring to FIG. 1D, compared with the semiconductor package 100A illustrated in FIG. 1A, the molding material 60 of a semiconductor package 100D according to an embodiment of the present disclosure may cover at least one edge of the top surface of the first semiconductor chip 21 and may expose at least one edge of top surface of the first semiconductor chip 21. The covered edge and the exposed edge may be opposite to each other. A top surface of the exposed edge of the first semiconductor chip 21 exposed in the opening Op and a recessed surface of the molding material 60 exposed in the opening Op may be co-planar.

Figure 1E:
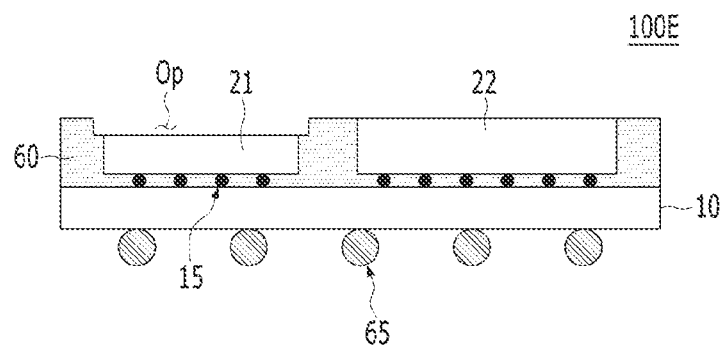

Referring to FIG. 1E, compared with the semiconductor package 100A illustrated in FIG. 1A, the opening Op of a semiconductor package 100E according to an embodiment of the present disclosure may expose at least two edges of the first semiconductor chip 21. The opening Op of the semiconductor package 100E may also cover two opposite edges of the first semiconductor chip 21, such as illustrated in FIG. 1A. Where the two opposite edges of the first semiconductor chip 21 are exposed may be two recessed surfaces of the molding material 60. For example, the molding material 60 of the semiconductor package 100A of FIG. 1A may cover all edges of the top surface of the first semiconductor chip 21, and the semiconductor package 100E of FIG. 1E may expose at least two edges of the top surface of the first semiconductor chip 21 with at least two corresponding recessed surfaces of the molding material 60.

Figure 1F:
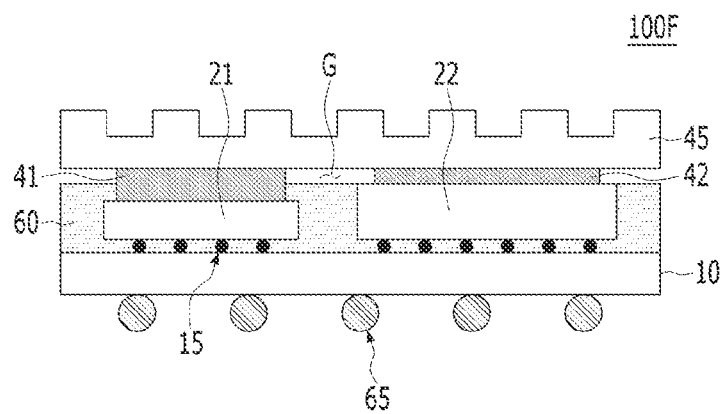

Referring to FIG. 1F, compared with the semiconductor package 100A of FIG. 1A, a semiconductor package 100F according to an embodiment of the present disclosure may further include adhesive layers 41 and 42 and a heat sink 45. The adhesive layers 41 and 42 may include a first adhesive layer 41 attaching the first semiconductor chip 21 to the heat sink 45 and a second adhesive layer attaching the second semiconductor chip 22 to the heat sink 45. The first adhesive layer 41 may fill the opening Op of FIG. 1A. An air gap G may be formed between the top surface of the molding material 60 and the bottom surface of the heat sink 45. The adhesive layers 41 and 42 may include a thermal interface material (TIM). The heat sink 45 may include a metal such as aluminum.

Figure 1G:
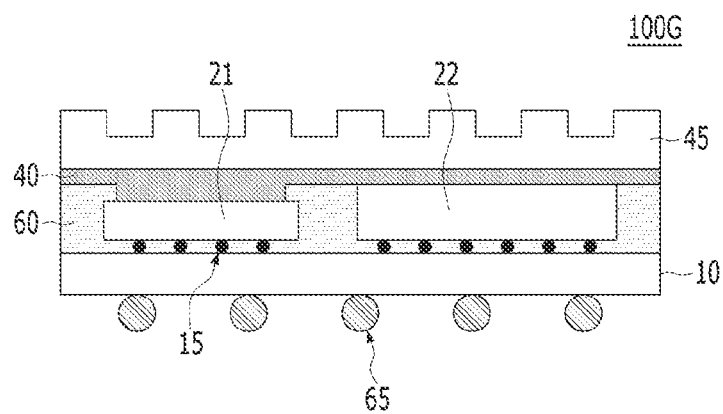

Referring to FIG. 1G, compared with the semiconductor package 100F of FIG. 1F, the adhesive layer 40 of a semiconductor package 100G according to an embodiment of the present disclosure may seal the air gap G between the molding material 60 and the heat sink 45. For example, the adhesive layer 40 of the semiconductor package 100G may fill the air gap G shown in FIG. 1F for the semiconductor package 100F.

The technical concepts of the semiconductor packages 100A-100G described with reference to FIGS. 1A to 1G may be variously combined.

FIGS. 2A to 2H, FIG. 3, and FIG. 4 are views for describing methods of manufacturing semiconductor packages according to various embodiments of the present disclosure.

Figure 2A:
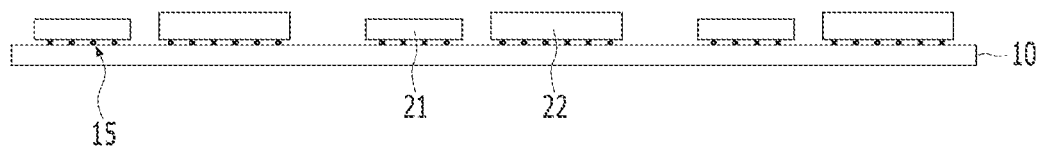
FIGS. 2A to 2H, FIG. 3, and FIG. 4 are views for describing methods of manufacturing semiconductor packages according to various embodiments of the present disclosure.

Referring to FIG. 2A, a method of manufacturing a semiconductor package according to an embodiment of the present disclosure may include mounting at least two semiconductor chips 21 and 22 on a package substrate 10. The semiconductor chips 21 and 22 may include a first semiconductor chip 21 and a second semiconductor chip 22. As described above, a vertical thickness of the first semiconductor chip 21 may thinner than a vertical thickness of the second semiconductor chip 22.

The method may further include disposing chip bumps 15 between the substrate 10 and the semiconductor chips 21 and 22. The chip bumps 15 may be provided before mounting the semiconductor chips 21 and 22 on the substrate 10. The chip bumps may include solder balls or metal pillars. A process of providing the chip bumps 15 may include heating the substrate 10, the semiconductor chips 21 and 22, and the chip bumps 15 to about 260° C. and melting and reflowing the chip bumps 15.

Figure 2B:
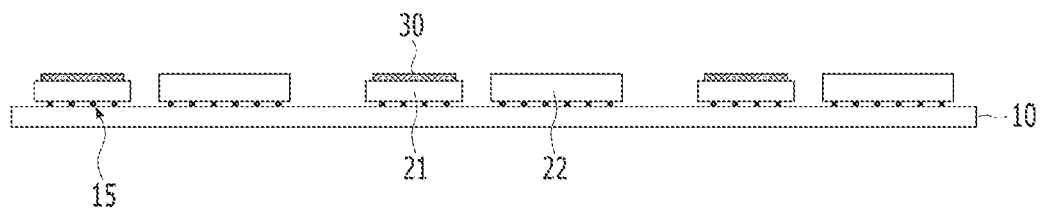

Referring to FIG. 2B, the method may further include forming an anti-molding film 30 on the top surface of the first semiconductor chip 21. A horizontal width of the anti-molding film 30 may be less than a horizontal width of the first semiconductor chip 21. Accordingly, a central region of the top surface of the first semiconductor chip 21 may be covered with the anti-molding film 30, and edges of the top surface of the first semiconductor chip 21 might not be covered with the anti-molding film 30. In an embodiment, at least one edge of the top surface of the first semiconductor chip 21 may be covered with the anti-molding film 30. At least one surface of the anti-molding film 30 may have an adhesive property. The anti-molding film 30 may include a thermosetting resin. For example, the anti-molding film 30 may include at least one of an epoxy resin, an acrylic resin, a polyimide, a polybenzoxazole, benzocyclobuten, polyethylene naphthalate, polyethylene terephthalate, and polyether ether ketone. In an embodiment, after attaching the anti-molding film 30 to the top surface of the first semiconductor chip 21, the method may further include performing a UV curing process involving irradiating with UV light or a heating process. The anti-molding film may be heated to 90° C. or higher by the UV curing process or the heating process. Adhesion between the anti-molding film 30 and the first semiconductor chip 21 may be weakened by the UV curing process or the heating process. In an embodiment, the anti-molding film 30 may include a double layer. For example, the anti-molding film 30 may include a lower layer in contact with the first semiconductor chip 21 and an upper layer on the lower layer. The lower layer of the anti-molding film 30 may have an adhesive property, but may have a property that the adhesive property is weakened by the UV curing process or the heating process so that the anti-molding film 30 can be easily separated from the first semiconductor chip 21. The upper layer of the anti-molding film 30 will be described later.

Figure 2C:
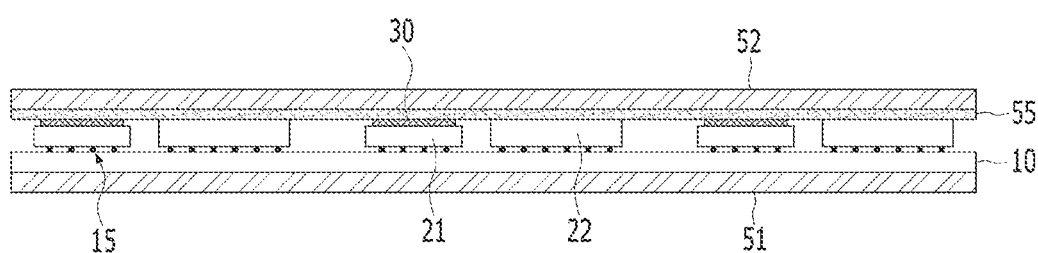

Referring to FIG. 2C, the method may further include loading the substrate 10 on which the semiconductor chips 21 and 22 are mounted between a lower mold frame 51 and an upper mold frame 52. The lower mold frame 51 may be in contact with a lower portion of the substrate 10, and the upper mold frame 52 may be in contact with upper portions of the semiconductor chips 21 and 22. A buffer film 55 may be provided between the upper mold frame 52 and the upper portions of the semiconductor chips 21 and 22 and the anti-molding film 30. The buffer film 55 may include a release film. The buffer film 55 and the anti-molding film 30 may be adhered. In one embodiment, one surface of the buffer film 55 might not have an adhesive property or may have a weak adhesive property. In another embodiment, both surfaces of the buffer film 55 might not have an adhesive property or may have a weak adhesive property.

Figure 2D:
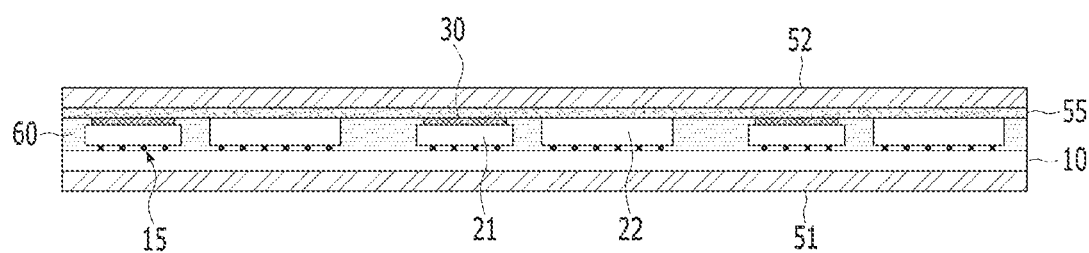

Referring to FIG. 2D, the method may further include providing a molding compound 60 between the lower mold frame 51 and the upper mold frame 52, and curing the molding compound 60 by performing a molding process. The molding material 60 may include an epoxy molding compound (EMC). The molding material 60 may be provided in a paste form, and may be hardened by a curing process. The buffer film 55 may be in contact with the anti-molding film 30 on the top surface of the first semiconductor chip 21 and the top surface of the second semiconductor chip 22. The buffer film 55 may prevent the molding material 60 from adhering to the upper mold frame 52. The buffer film 55 may prevent the molding material 60 from permeating onto the top surface of the anti-molding film 30 on the first semiconductor chip 21 and onto the top surface of the second semiconductor chip 22.

Figure 2E:
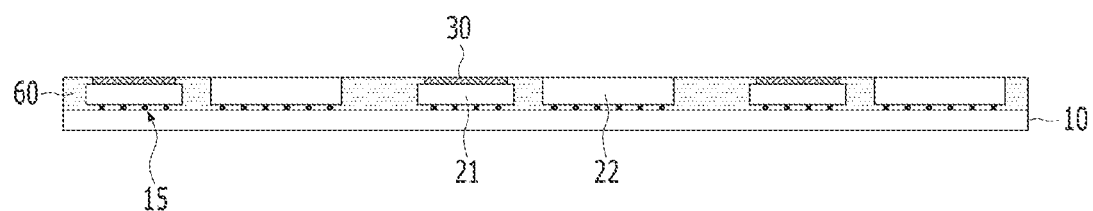

Referring to FIG. 2E, the method may further include removing the lower mold frame 51, the upper mold frame 52, and the buffer film 55. The lower surface of the substrate 10, the top surface of the anti-molding film 30 on the first semiconductor chip 21, and the top surface of the second semiconductor chip 22 may be exposed. The top surface of the molding material 60, the top surface of the second semiconductor chip 22, and the top surface of the anti-molding film 30 on the top surface of the first semiconductor chip 21 may be co-planar.

The molding process and the curing process may include a heating process. By the molding process, the molding material 60 and the anti-molding film 30 may be heated to 250° C. or higher. The adhesion property of the anti-molding film 30 may be weakened by the heating process. The upper layer of the anti-molding film 30 may include a material that can be easily separated from the buffer film 55 by the heating process. Alternatively, the adhesion property of the upper layer of the anti-molding film 30 may be weakened by the molding process.

Figure 2F:
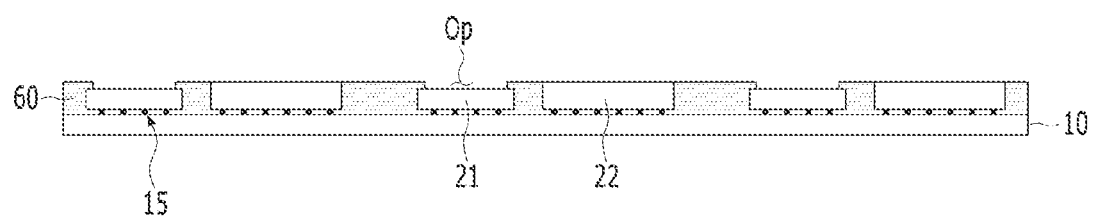

Referring to FIG. 2F, the method may further include removing the anti-molding film 30 from the top surface of the first semiconductor chip 21. Openings Op exposing the top surface of the first semiconductor chip 21 may be formed. The molding material 60 may expose or leave a central region of the top surface of the first semiconductor chip 21 exposed and cover edges of the top surface of the first semiconductor chip 21.

Figure 2G:
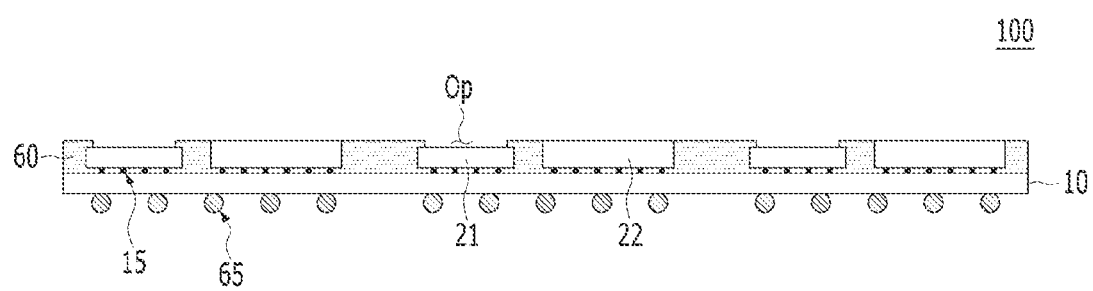

Referring to FIG. 2G, the method may further include providing package bumps 65 on a lower surface of the substrate 10. The package bumps 65 may include solder balls or metal pillars. A mass semiconductor package 100 including a plurality of first semiconductor chips 21 and second semiconductor chips 22 mounted on one integrated substrate 10 may be manufactured.

Figure 2H:
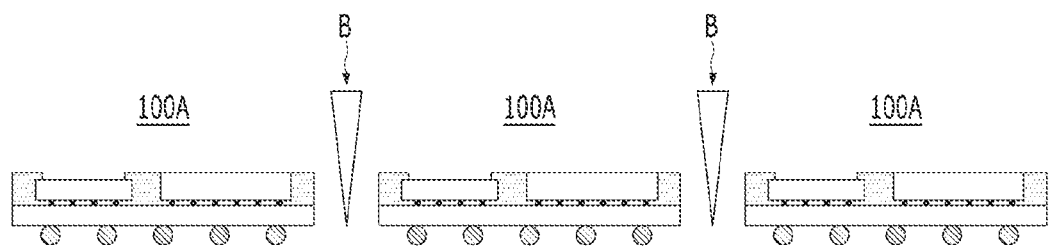

Referring to FIG. 2H, the method may include manufacturing the semiconductor packages 100A by performing a sawing process using a blade B to separate the mass semiconductor package 100.

In the present embodiment, a grinding process for exposing the top surfaces of the semiconductor chips 21 and 22 may be omitted. Because the grinding process grinds the top surfaces of the semiconductor chips 21 and 22 using a grinder, physical damage may be caused to the semiconductor chips 21 and 22 and the chip bumps 15. In this embodiment, because the grinding process is omitted, physical damage to the semiconductor chips 21 and 22 and the chip bumps 15 may be prevented or reduced.

Figure 3:
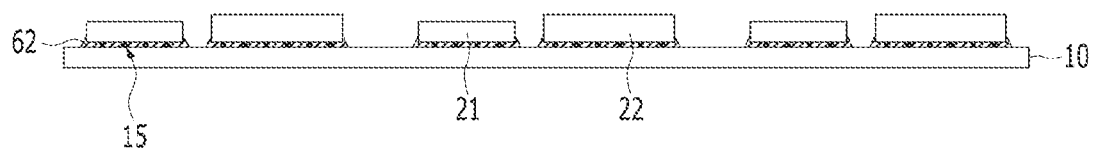

Referring to FIG. 3, a method of manufacturing a semiconductor package according to an embodiment of the present disclosure may include mounting a plurality of semiconductor chips 21 and 22 on a package substrate 10 and forming an underfill 62. The underfill 62 may be provided between the substrate 10 and the semiconductor chips 21 and 22 to surround the chip bumps 15. The underfill 62 may include an epoxy resin. Thereafter, the method may further include performing the processes described with reference to FIGS. 2B to 2H to manufacture the semiconductor package 100B illustrated in FIG. 1B.

Figure 4:
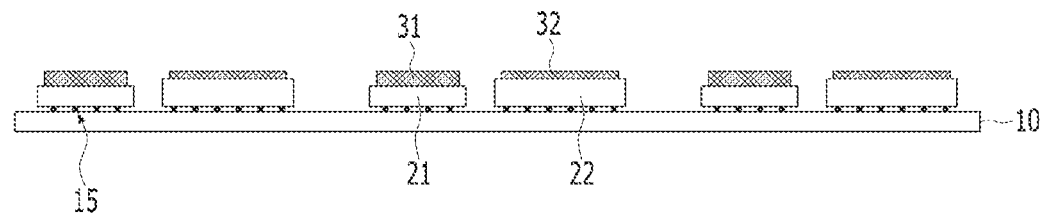

Referring to FIG. 4, a method of manufacturing a semiconductor package according to an embodiment of the present disclosure may include mounting a plurality of semiconductor chips 21 and 22 on a package substrate 10 and providing anti-molding films 31 and 32 on top surfaces on the semiconductor chips 21 and 22, respectively. Because a vertical thickness of the first semiconductor chip 21 is less than a vertical thickness of the second semiconductor chip 22, a vertical thickness of the first anti-molding film 31 may be greater than a vertical thickness of the second anti-molding film 32. A top surface of the first anti-molding film 31 and a top surface of the second anti-molding film 32 may be co-planar.

Thereafter, the method may further include performing the processes described with reference to FIGS. 2C to 2H to manufacture the semiconductor package 100C illustrated in FIG. 1C.

According to embodiments of the present disclosure, a semiconductor package may be manufactured without some mechanical and physical processes. Accordingly, during the manufacturing process, mechanical and physical stress applied to the semiconductor package can be reduced or avoided. Performance of the semiconductor package may be maintained, yield and productivity may be increased, and manufacturing cost may be reduced.

While the present teachings have been described with respect to specific embodiments, it will be apparent to those skilled in the art that various changes and modifications may be made without departing from the spirit and scope of the present teachings as defined in the following claims.

What is claimed is:

1. A method of manufacturing a semiconductor package, the method comprising:

mounting a first semiconductor chip and a second semiconductor chip on a substrate;
forming a first film on a top surface of the first semiconductor chip;
loading the first semiconductor chip and the second semiconductor chip mounted on the substrate between a lower mold frame and an upper mold frame;
providing a molding material between the lower mold frame and the upper mold frame;
removing the lower mold frame and the upper mold frame; and
removing the first film on the top surface of the first semiconductor chip to expose the top surface of the first semiconductor chip.

2. The method of claim 1, wherein:
a first vertical thickness of the first semiconductor chip is thinner than a second vertical thickness of the second semiconductor chip; and
a level of the top surface of the first semiconductor chip is lower than a level of a top surface of the second semiconductor chip.

3. The method of claim 1, further comprising:
providing a second film between the first film and the upper mold frame,
wherein the second film is in contact with the top surface of the first film and a top surface of the second semiconductor chip.

4. The method of claim 1,
wherein a top surface of the first film on the first semiconductor chip and a top surface of the second semiconductor chip are co-planar.

5. The method of claim 1,
wherein a horizontal width of the first film is less than a horizontal width of the first semiconductor chip.

6. The method of claim 1, further comprising:
providing an adhesive layer on the exposed top surface of the first semiconductor chip and a top surface of the second semiconductor chip; and
attaching a heat sink on the adhesive layer.

7. The method of claim 6,
wherein the adhesive layer includes a first adhesive layer on the top surface of the first semiconductor chip and a second adhesive layer on the top surface of the second semiconductor chip, and
wherein an air gap is formed vertically between the molding material and the heat sink and horizontally between the first adhesive layer and the second adhesive layer.

8. The method of claim 1,
wherein a top surface of the molding material and a top surface of the second semiconductor chip are co-planar.

9. The method of claim 1,
wherein forming the first film includes attaching the first film on the top surface of the first semiconductor chip and performing a curing process to cure the first film.

10. The method of claim 9,
wherein the curing process includes heating the first film to at least 90° C. using at least one of an ultraviolet (UV) curing process or a heating process.

11. The method of claim 1, further comprising, before forming the first film:
forming chip bumps between the substrate and the first semiconductor chip and between the substrate and the second semiconductor chip; and forming an underfill surrounding the chip bumps, a portion of a side surface of the first semiconductor chip, and a portion of a side surface of the second semiconductor chip.

12. A method of manufacturing a semiconductor package, the method comprising:
mounting a first semiconductor chip having a first thickness and a second semiconductor chip having a second thickness on a substrate, the first thickness being thinner than the second thickness;
forming a first anti-molding film on a top surface of the first semiconductor chip;
forming a buffer film on a top surface of the first anti-molding film and a top surface of the second semiconductor chip;
forming a molding material on the substrate, the molding material surrounding a side surface of the first semiconductor chip, a side surface of the first anti-molding film, and a side surface of the second semiconductor chip;
removing the buffer film; and
removing the first anti-molding film to expose a central region of the top surface of the first semiconductor chip,
wherein the molding material covers at least one edge of the top surface of the first semiconductor chip.

13. The method of claim 12, further comprising:
forming a second anti-molding film on the top surface of the second semiconductor chip before forming the molding material; and
removing the second anti-molding film to expose a central region of the top surface of the second semiconductor chip after removing the buffer film,
wherein:
the molding material further surrounds a side surface of the second anti-molding film,
the buffer film is formed on the top surface of the second anti-molding film, and
a vertical thickness of the first anti-molding film is thicker than a vertical thickness of the second anti-molding film.

14. The method of claim 13, further comprising:
forming a first opening exposing the top surface of the first semiconductor chip by removing the first anti-molding film; and
forming a second opening exposing the top surface of the second semiconductor chip by removing the second anti-molding film,
wherein a depth of the first opening is greater than a depth of the second opening.

15. The method of claim 12,
wherein the top surface of the first anti-molding film and a bottom surface of the buffer film are in direct contact with each other.

16. A semiconductor package comprising:
a first semiconductor chip having a first vertical thickness and a second semiconductor chip having a second vertical thickness, the first vertical thickness being thinner than the second vertical thickness; and
a molding material surrounding side surfaces of the first semiconductor chip and side surfaces of the second semiconductor chip,
wherein the molding material includes a first opening exposing a central region of a top surface of the first semiconductor chip,
wherein the molding material covers at least one edge of the top surface of the first semiconductor chip, wherein the first opening further exposes a recessed surface of the molding material, and wherein the exposed top surface of the first semiconductor chip and the exposed recessed surface of the molding material are co-planar in the first opening.

17. The semiconductor package of claim 16, wherein a top surface of the second semiconductor chip and a top surface of the molding material are co-planar.

18. The semiconductor package of claim 16, wherein the molding material includes a second opening exposing a central region of a top surface of the second semiconductor chip, and wherein the molding material covers at least one edge of the top surface of the second semiconductor chip.

19. The semiconductor package of claim 18, wherein a depth of the first opening is greater than a depth of the second opening.

* * * * *